United States Patent [19]

Dunnavant et al.

[11] Patent Number: 4,780,489
[45] Date of Patent: Oct. 25, 1988

[54] MODIFIERS FOR AQUEOUS BASIC SOLUTIONS OF PHENOLIC RESOLE RESINS

[75] Inventors: William R. Dunnavant, Columbus; Robert B. Fechter, Worthington; Gary R. Hysell, Columbus; Young D. Kim, Dublin; Heimo J. Langer, Columbus, all of Ohio

[73] Assignee: Ashland Oil, Inc., Russell, Ky.

[21] Appl. No.: 50,996

[22] Filed: May 15, 1987

[51] Int. Cl.$^4$ .......................... C08K 5/07; C08K 5/06
[52] U.S. Cl. .................................... 523/145; 523/147; 524/361; 524/364; 524/377; 164/16; 164/527
[58] Field of Search .............. 523/145, 147; 524/361, 524/364, 377; 164/16, 527

[56] References Cited

U.S. PATENT DOCUMENTS

| | | | |
|---|---|---|---|
| 4,097,443 | 6/1978 | Nakamura et al. | 523/145 |
| 4,283,319 | 8/1981 | Konii et al. | 523/145 |
| 4,426,467 | 1/1984 | Quist et al. | 524/594 |
| 4,452,927 | 6/1984 | Matsushima et al. | 523/145 |
| 4,468,359 | 8/1984 | Lemon et al. | 523/145 |
| 4,474,904 | 10/1984 | Lemon et al. | 524/196 |
| 4,501,836 | 2/1985 | Nakamura et al. | 523/147 |

FOREIGN PATENT DOCUMENTS 3527086 1/1987 Fed. Rep. of Germany .

OTHER PUBLICATIONS

Borden's Material Safety Data Sheet for Betaset 9500 dated Oct. 15, 1986.

*Primary Examiner*—Lewis T. Jacobs
*Attorney, Agent, or Firm*—David L. Hedden

[57] ABSTRACT

The subject invention relates to modifiers for aqueous basic solutions of phenolic resins. The modifiers are open-chain ether alcohols or ketone alcohols. They assist in stabilizing the aqueous basic solutions of phenolic resole resins and improve the tensile strength of foundry shapes prepared from foundry mixes made with the aqueous basic solutions.

32 Claims, No Drawings

MODIFIERS FOR AQUEOUS BASIC SOLUTIONS OF PHENOLIC RESOLE RESINS

TECHNICAL FIELD

The subject invention relates to modifiers for aqueous basic solutions of phenolic resins. The modifiers are open-chain ether alcohols or ketone alcohols. They assist in stabilizing the aqueous basic solutions of phenolic resole resins and improve the tensile strength of foundry shapes prepared from foundry mixes made with the aqueous basic solutions.

BACKGROUND OF THE INVENTION

Aqueous basic solutions of phenolic resins are known in the art. They are used in making foundry mixes which are made into foundry shapes. The shapes are cured with esters by a no-bake or cold-box process depending upon whether a volatile ester is used for curing.

Although these processes have advantages from an environmental standpoint, they also have limitations. One of the primary limitations is that the tensile strengths are lower than for some of the other no-bake and cold-box processes used for preparing workable foundry shapes. Furthermore, the stability of these aqueous basic solutions of phenolic resole resins is primarily dependent upon using large quantities of base, particularly potassium hydroxide.

SUMMARY OF THE INVENTION

The subject invention relates to a binder composition comprising in admixture:
1. an aqueous baic solution of a phenolic resole resin wherein said aqueous basic solution has
   a. a viscosity of less than about 850 centipoise at 25° C.;
   b. a solids content of about 35 to about 75 percent by weight, said weight based upon the total weight of the basic solution; and
   c. an equivalent ratio of base to phenol of about 0.2:1.0 to 1.1:1.0; and
2. a modifier selected from the group consisting of ether alcohols, ketone alcohols, and mixtures thereof, wherein said modifier is used in an amount effective in foundry applications.

The subject invention also relates to foundry mixes prepared with the aqueous basic solutions; a process for preparing workable foundry shapes and the shapes prepared thereby with the foundry mixes; and a process for preparing metal castings with the workable foundry shapes, and the castings prepared thereby.

The subject aqueous basic solutions are more stable than those without the ether alcohols. They also produce workable foundry shapes with higher tensile strengths than those without the ether alcohols, particularly when used in a cold box process where curing is conducted with a volatile ester.

BEST MODE AND OTHER MODES FOR CARRYING OUT THE INVENTION

The aqueous basic solutions of phenolic resole resins used in the subject binder compositions are prepared by methods well known in the foundry art. The general procedure involves reacting an excess of aldehyde with a phenolic compound in the presence of a basic catalyst at temperatures of about 50° C. to 120° C. to prepare a phenolic resole resin. Generally the reaction will also be carried out in the presence of water. The resulting phenolic resole resin is diluted with a base and/or water so that an aqueous basic solution of the phenolic resole resin results having the following characteristics:

1. a viscosity of less than about 850 centipoise, preferably less than about 450 centipoise at 25° C. as measured with a Brookfield viscometer, spindle number 3 at number 12 setting;
2. a solids content of 35 percent by weight to 75 percent by weight, preferably 50 percent by weight to 60 percent by weight, based upon the total weight of the aqueous basic solution, as measured by a weight loss method by diluting 0.5 gram of aqueous resole solution with one milliliter of toluene and then heating on a hotplate at 150° C. for 15 minutes; and
3. an equivalent ratio of base to phenol of from 0.2:1.0 to 1.1:1.0, preferably from 0.3:1.0 to 0.95:1.0.

As an alternative to the procedure outlined, it may be possible to prepare the aqueous basic solutions by dissolving all of the base in phenol and then reacting with formaldehyde until the desired properties are achieved.

It has been found that aqueous basic solutions having viscosities outside the cited range are difficult to use in foundry applications. Aqueous basic solution with a solids content below the cited range will not sufficiently coat the aggregate while those having a solids content above the cited range will not be sufficiently flowable in the molding equipment. The equivalent ratio specified for the base relates to the need for having solutions which have adequate shelf stability.

Although these ranges have been specified, it should be pointed out that it is not claimed that these aqueous basic solutions are novel products, or that the ranges are critical. The ranges are set forth to provide guidelines for those who want to make and use the invention. Obviously, the invention will usually be practiced more effectively in the preferred ranges speeified. With this in mind, more specific procedures will be set forth for preparing phenolic resole resins.

The phenolic compounds used to prepare the phenolic resole resins can be represented by the following structural formula:

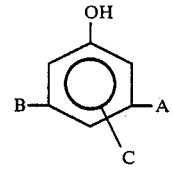

wherein A, B, and C are hydrogen, or hydrocarbon radicals or halogen.

The aldehyde used in preparing the phenolic resole resin may also vary widely. Suitable aldehydes include aldehydes such as formaldehyde, acetaldehyde, propionaldehyde, furfuraldehyde, and benzaldehyde. In general, the aldehydes used have the formula RCHO, where R is a hydrogen or a hydrocarbon radical of 1 to 8 carbon atoms. The most preferred aldehyde is formaldehyde.

The basic catalysts used in preparing the phenolic resole resin include basic catalysts such as alkali or alkaline earth hydroxides, and organic amines. The amount of catalyst used will vary depending upon the specific purposes. Those skilled in the art are familiar with the levels needed.

It is possible to add compounds such as lignin and urea when preparing the phenol-formaldehyde resole resins as long as the amount is such that it will not detract from achieving the desired properties of the aqueous basic solutions. Urea is added as a scavenger to react with unreacted formaldehyde and remove the odor caused by it.

The phenolic resole resins used in the practice of this invention are generally made from phenol and formaldehyde at a mole ratio of formaldehyde to phenol in the range of from about 1.1:1.0 to about 3.0:1.0. The most preferred mole ratio of formaldehyde to phenol is a mole ratio in the range of from about 1.4:1.0 to about 2.2:1.0.

As was mentioned previously, the phenolic resole resin is either formed in the aqueous basic solution, or it is diluted with an aqueous basic solution. The base used in the aqueous basic solution is usually an alkali or alkaline earth metal hydroxide such as potassium hydroxide, sodium hydroxide, calcium hydroxide, or barium hydroxide, preferably potassium hydroxide.

It should again be mentioned that the aqueous basic solutions described herein are not novel products, nor is their method of preparation. The parameters set forth pertaining to their preparations are merely guidelines for those who want to make the aqueous basic solutions. There may be other effective ways to make them which are not described herein.

Ether alcohols and ketone alcohols which are used as modifiers in the binding compositions are open-chain organic compounds, preferably aliphatic hydrocarbon compounds, containing at least one ether group or at least one ketone group, and at least one hydroxyl group. Representative examples of ether alcohols include propylene glycol methyl ether, propoxy propanol, tripropylene glycol methyl ether, dipropylene glycol methyl ether, ethylene glycol methyl ether, diethylene glycol methyl ether, diethylene glycol ethyl ether, diethylene glycol butyl ether, ethylene glycol n-butyl ether, diethylene glycol ether, and triethylene glycol ether. A representative ketone alcohol which is commercially available is diacetone alcohol.

Although the ether alcohols and ketone alcohols can be used in foundry applications in any amount effective to increase the tensile strength of foundry shapes made with the aqueous basic solutions or in any effective amount to improve the stability of the aqueous basic solutions, they generally are used in an amount of at least about 1.0 weight percent based upon the weight of the aqueous basic solution of phenolic resole resin, preferably from about 3.0 to about 7.0 weight percent. Generally there is no improvement in tensile strengths of foundry shapes when the ether alcohols are used in amounts greater than 10.0 weight percent and it is not economical to use them above this level. Foundry mixes are prepared according to conventional methods by mixing an effective amount of the binding composition with a foundry aggregate.

An effective binding amount of the aqueous basic solution of phenolic resole resin is generally from 0.5 weight percent to 7.0 weight percent of solution, based upon the weight of the aggregate, usually from 1.0 weight percent to 3.0 weight percent of binder.

The aggregate used to prepare the foundry mixture is that typically used in the foundry industry for such purposes or any aggregate which will work for such purposes. Generally the aggregate will be sand which contains at least percent by weight silica. Other suitable aggregate materials include zircon, olivine, alumina-silicate sand, chromite sand, and the like. Generally, the particle size of the aggregate is such that at least 80 percent by weight of the aggregate has an average particle size between 50 and 150 mesh (Tyler Screen Mesh).

It will be apparent to those skilled in the art that other additives such as silanes, silicones, benchlife extenders, release agents solvents, etc., can be used and added to the binder composition, aggregate, foundry mix, or combinations thereof for specific problems or purposes.

Workable foundry shapes are prepared with the foundry mixes by introducing them into a corebox, pattern mold, or other shaping device according to techniques well known in the art. The foundry mix is cured to form workable shapes by passing an ester through it, preferably by a cold box process using a volatile ester such as a $C_1$-$C_4$ alkyl formate. Particularly useful as the ester curing agent is methyl formate. A workable foundry shape is one which can be handled without breaking when it leaves the corebox or pattern mold. Curing is carried out according to techniques well known in the art.

Metal castings are produced from the workable foundry shapes in a conventional manner. Essentially, molten metal (ferrous and non-ferrous) is poured into and around the workable foundry shape and allowed to harden. The workable foundry shape is then removed.

In the Examples, the aqueous basic solution of a phenolic resole resin (hereinafter referred to as the resin solution) used was prepared as follows:

A 1:1.53 phenol-formaldehyde base catalyzed resole condensate is prepared by heating a stirred mixture of 337.6 parts of phenol, 181.1 parts of 91% paraformaldehyde, 124.7 parts of water and 5.3 parts of 50% sodium hydroxide solution in 30 minutes to 80° C. To this mixture is added 5.3 parts of 50% sodium hydroxide solution and heating is continued to reflux conditions. The reaction is held at reflux for 15 minutes and then cooled to 60° C. To this reaction mixture, 114.5 parts of 50% sodium hydroxide solution is added. The reaction mixture is then held at 85° C. and held at that temperature for 90-120 minutes, and then is cooled to 60° C. Then 231.5 parts of 50% potassium hydroxide is added and the reaction mixture is cooled to room temperature. The resulting aqueous phenolic resole solution has a 60.8 percent solids content and a viscosity as specified in the examples. (The viscosity varied because different batches of the resin solution were used in some of the examples.) The resole solution has an equivalent ratio of base to phenol of about 0.92:1.0.

The examples which follow will illustrate specific embodiments of the invention. They are not intended to imply that the invention is limited to these embodiments. The temperatures in the examples are in degrees Centigrade and the parts are parts by weight unless otherwise specified.

In the Examples the following abbreviations will be used:

DEGBE=diethylene glycol butyl ether
DEGEE=diethylene glycol ethyl ether
DEGME=diethylene glycol methyl ether
DA=diacetone alcohol
EGBE=ethylene glycol n-butyl ether
EGEE=ethylene glycol ethyl ether
EGME=ethylene glycol methyl ether PGME=propylene glycol methyl ether
PP=propoxy propanol
TEGE=triethylene glycol ether
TGME=tripropylene glycol methyl ether

EXAMPLES

Several binder compositions were prepared by mixing three percent by weight, based upon the weight of the resin solution of various ether alcohols with a resin solution having a viscosity of 134 cps at 25° C. The specific ether alcohols used in the binder compositions are set forth in Table I. The binding compositions were subjected to an accelerated aging process by storing them in an oven at 40° C.

The initial viscosities (in centipoise) of the binder compositions (containing the ether alcohol) and their viscosities after 3, 7, 14, 21, 28, and 35 days were measured. An increase in the viscosity over time indicates the binder composition is unstable. Table I indicates that the binder compositions containing an ether alcohol were more stable than the control which did not contain an ether alcohol.

TABLE I

| | (Viscosity as a function of time for various binder compositions) | | | | | | | |
|---|---|---|---|---|---|---|---|---|
| | | Viscosity (cps) | | | | | | |
| EXAMPLE | ETHER ALCOHOL | INITIAL | 3 DAYS | 7 DAYS | 14 DAYS | 21 DAYS | 28 DAYS | 35 DAYS |
| Control | O | 134 | 161 | 198 | 411 | 1026 | — | 2552 |
| 1 | DEGBE | 142 | 166 | 200 | — | 715 | 982 | 1364 |
| 2 | PGME | 127 | 146 | 177 | 285 | 483 | 714 | 1024 |
| 3 | PP | 142 | 173 | 213 | 290 | 396 | 577 | 874 |

Foundry mixes were prepared with various binder compositions by mixing two percent by weight, based upon the weight of sand, of the binding composition with Wedron 510 sand. The mixture was forced into a standard AFS core box (dog bone shape) by air blowing. The shaped mix was cured by passing methyl formate vapor through it (about 30% by weight based upon the weight of the binder) under 2 psig. Tensile strengths (in psi) of the cured samples were then measured immediately, 1 hour, 3 hours, and 24 hours after curing. The tensile strength was also measured on samples 24 hours after curing which had then been aged for 1 hour at a relative humidity of 100%.

In all of these examples the same resin solution (described previously) was used. Table II shows what ether alcohols were used in the binding compositions. In all cases three percent by weight of the ether alcohol was used, based upon the weight of the resin solution. The viscosity of the resin solution without the ether alcohol was 140 cps. The tensile strengths are shown in TABLE II. The data in TABLE II indicate that the addition of an ether alcohol to the resin solution results in better tensile strengths for the foundry shapes.

TABLE II

| (Tensile strengths of foundry shapes prepared with various binding compositions) | | | | | |
|---|---|---|---|---|---|
| | | TENSILE, PSI | | | |
| Example | Ether Alcohol | IMM | 1 HR | 3 HR | 24 HR | 24 + 1 HR 100% RH |
| Control | None | 93 | 81 | 84 | 93 | 104 |
| 4 | EGME | 83 | 131 | 133 | 123 | 115 |
| 5 | EGEE | 114 | 125 | 122 | 128 | 120 |
| 6 | EGBE | 111 | 132 | 134 | 114 | 111 |
| 7 | DEGME | 92 | 141 | 122 | 114 | — |
| 8 | DEGEE | 100 | 113 | 140 | 121 | 112 |
| 9 | DEGBE | 104 | 140 | 128 | 109 | 109 |
| 10 | PGME | 108 | 130 | 127 | 111 | 86 |
| 11 | DA | 99 | 111 | 135 | 92 | 93 |
| 12 | FA | 101 | 121 | 156 | 96 | — |

The procedure of Examples 5–13 was followed except the various binder compositions as described in TABLE III were used. The viscosity of the control is the viscosity of the resin solution without the ether glycol modifier. Again the data indicate that foundry shapes prepared with a binder composition containing an ether alcohol have better tensile strengths. TABLE III also shows the effect of using various levels of DEGME and TEGE.

TABLE III

| Example | Ether Alcohol | VIS (RS) cps | Weight % Ether Alcohol | TENSILES, PSI | | | | |
|---|---|---|---|---|---|---|---|---|
| | | | | IMM | 1 HR | 3 HR | 24 HR | 24 + 1 HR |
| | Control | 211 | — | 67 | 51 | 82 | 91 | 88 |
| 13 | DEGBE | 216 | 3 | 97 | 99 | 108 | 121 | 103 |
| 14 | DEGBE | 224 | 5 | 92 | 110 | 126 | 133 | 103 |
| 15 | DEGBE | 226 | 7 | 80 | 131 | 130 | 120 | 97 |
| 16 | DEGBE | 224 | 10 | 61 | 111 | 123 | 119 | 105 |
| 17 | TEG | 186 | 3 | 78 | 92 | 99 | 104 | 105 |
| 18 | TEG | 206 | 5 | 86 | 105 | 115 | 123 | 92 |
| 19 | TEG | 231 | 7 | 93 | 93 | 136 | 143 | 114 |
| 20 | TEG | 236 | 10 | 85 | 110 | 120 | 129 | 113 |

We claim:
1. A binder composition comprising:
   A. an aqueous basic solution of a phenolic resole wherein said aqueous basic solution has
      1. a viscosity of less than about 850 centipoise at 25? C.;
      2. a solids content of about 35 to about 75 percent by weight, said weight based upon the total weight of the basic solution; and
      3. an equivalent ratio of base to phenol of about 0.2:1.0 to 1 1:1.0; and
   B. a modifier selected from the group consisting of open-chain ether alcohols, ketone alcohols, and mixtures thereof, wherein said modifier is used in an amount of at least 1.0 weight percent based upon the weight of the aqueous solution of phenolic resole resin.
2. The binder composition of claim 1 wherein the modifier is an ether alcohol.

3. The binder composition of claim 2 wherein the phenolic resole resin is prepared by reacting formaldehyde and phenol in a mole ratio of formaldehyde to phenol of about 1.1:1.0 to about 2.2:1.0 in the presence of an effective amount of a basic catalyst at elevated temperature of about 50° C. to about 120° C.

4. The binder composition of claim 3 wherein the equivalent ratio of base of phenol used in preparing the aqueous basic solution is from 0.3:1.0 to 0.95:1.0.

5. The binder composition of claim 4 wherein the base is selected from the group consisting of sodium hyrdoxide, potassium hydroxide, and mixture thereof.

6. The binder composition of claim 4 where the viscosity of the phenolic resin is from less than about 450 centipoise at 25° C.

7. The binder composition of claim 6 where the ether alcohol is used in an amount of about 3 weight percent to about 10 weight percent, said weight percent based upon the weight of the aqueous basic solution.

8. The binder composition of claim 6 where the ether alcohol is used in an amount of about 5 weight percent to about 7 weight percent, said weight percent based upon the weight of the aqueous basic solution.

9. The binder composition of claim 8 wherein the ether alcohol is selected from the group consisting of triethylene glycol ether and diethylene glycol butyl ether.

10. A foundry mix comprising:
 A. a foundry aggregate; and
 B. an effective binding amount of the binder composition of claim 1.

11. A foundry mix comprising:
 A. a foundry aggregate; and
 B. an effective binding amount of the binder composition of claim 2.

12. A foundry mix comprising:
 A. a foundry aggregate; and
 B. an effective amount of the binder composition claim 3.

13. A foundry mix comprising:
 A. a foundry aggregate; and
 B. an effective binding amount of the binder composition of claim 4.

14. A foundry mix comprising:
 A. a foundry aggregate; and
 B. an effective binding amount of the binder composition of claim 5.

15. A foundry mix comprising:
 A. a foundry aggregate; and
 B. an effective binding amount of the binder composition of claim 6.

16. A foundry mix comprising:
 A. a foundry aggregate; and
 B. an effective binding amount of the binder composition of claim 7.

17. A foundry mix comprising:
 A. a foundry aggregate; and
 B. an effective binding amount of the binder composition of claim 8.

18. A foundry mix comprising:
 A. a foundry aggregate; and
 B. an effective binding amount of the binder composition of claim 9.

19. A process for preparing a workable foundry shape comprising:
 A. injecting the foundry mix of claim 10 into a corebox or pattern mold;
 B. curing said foundry mix with an volatile ester until a workable shape is formed.

20. The process of claim 19 wherein the ester is a $C_1$ to $C_4$ alkyl formate.

21. The process of claim 20 wherein the ester is methyl formate.

22. A workable foundry shape prepared according to claim 19.

23. A process for forming a metal casting comprising:
 A. forming a workable foundry shape according to claim 19;
 B. pouring molten metal into or around said shape;
 C. allowing said metal to cool and soldify; and
 D. removing the metal casting.

24. A metal casting formed in accordance with claim 23.

25. A process for preparing a workable foundry shape comprising:
 A. injecting the foundry mix of claim 11 into a corebox or pattern mold;
 B. curing said foundry mix with a volatile ester until a workable shape is formed.

26. A process for preparing a workable foundry shape comprising:
 A. injecting the foundry mix of claim 12 into a corebox or pattern mold;
 B. curing said foundry mix with a volatile ester until a workable shape is formed.

27. A process for preparing a workable foundry shape comprising:
 A. injecting the foundry mix of claim 13 into a corebox or pattern mold;
 B. curing said foundry mix with a volatile ester until a workable shape is formed.

28. A process for preparing a workable foundry shape comprising:
 A. injecting the foundry mix of claim 14 into a corebox or pattern mold;
 B. curing said foundry mix with a volatile ester until a workable shape is formed.

29. A process preparing a workable foundry shape comprising:
 A. injecting the foundry mix of claim 15 into a corebox or pattern mold;
 B. curing said foundry mix with a volatile ester until a workable shape is formed.

30. A process for preparing a workable foundry shape comprising:
 A. injecting the foundry mix of claim 16 into a corebox or pattern mold;
 B. curing said foundry mix with a volatile ester until a workable shape is formed.

31. A process for preparing a workable foundry shape comprising:
 A. injecting the foundry mix of claim 17 into a corebox or pattern mold;
 B. curing said foundry mix with a volatile ester until a workable shape is formed.

32. A process for preparing a workable foundry shape comprising:
 A. injecting the foundry mix of claim 18 into a corebox or pattern mold;
 B. curing said foundry mix with a volatile ester until a workable shape is formed.

* * * * *